United States Patent [19]

Hussla et al.

[11] Patent Number: 4,947,789
[45] Date of Patent: Aug. 14, 1990

[54] APPARATUS FOR VAPORIZING MONOMERS THAT FLOW AT ROOM TEMPERATURE

[75] Inventors: Ingo Hussla, Hanau am Main; Jochen Ritter, Laubach, both of Fed. Rep. of Germany

[73] Assignee: Leybold Aktiengesellschaft, Hanau I, Fed. Rep. of Germany

[21] Appl. No.: 267,077

[22] Filed: Nov. 4, 1988

[30] Foreign Application Priority Data

Sep. 30, 1988 [DE] Fed. Rep. of Germany ....... 3833232

[51] Int. Cl.⁵ ............................................. C23C 16/00
[52] U.S. Cl. ..................................... 118/715; 118/724; 118/726; 122/366; 219/274
[58] Field of Search .................. 118/715, 724, 726; 219/271, 273, 274, 275; 122/366; 239/34

[56] References Cited

U.S. PATENT DOCUMENTS

| 2,472,992 | 6/1949 | Szekely | 219/274 |
| 3,288,556 | 11/1966 | Weber, III | 219/274 |
| 3,607,368 | 9/1971 | Van Amstel | 219/274 |
| 3,723,706 | 3/1973 | Van Amstel | 219/274 |
| 3,875,926 | 4/1975 | Frank | 122/366 |
| 4,748,314 | 5/1988 | Desage | 219/271 |

FOREIGN PATENT DOCUMENTS

672097 5/1952 United Kingdom ................ 219/274

OTHER PUBLICATIONS

Chin, B. L. and E. P. van de Ven, "Plasma TEOS Process for Interlayer Dielectric Applications", Solid State Technology (Apr. 1988) pp. 119–122.

Mukherjee, S. P. and P. E. Evans, "The Deposition of Thin Films by the Decomposition of Tetraethoxysilane in a Radio Frequency Glow Discharge", Thin Solid Films (1972) pp. 105–118.

Mackens, U. and U. Merkt, "Plasma-Enhanced Chemically Vapour-Deposited Silicon Dioxide for Metal/Oxide Semiconductor Structure on InSb", Thin Solid Films (1982) pp. 53–61.

Howard, R. E., "Selecting Semiconductor Dopants for Precise Process Control, Product Quality and Yield and Safety", Microelectronic Manufacturing and Testing, (Dec. 1985) pp. 20–24.

*Primary Examiner*—Richard Bueker
*Assistant Examiner*—Terry J. Ownes
*Attorney, Agent, or Firm*—Felfe & Lynch

[57] ABSTRACT

An evaporator chamber has an entry end with a conduit connected to the output of a mass flow regulator, an exit end connected to a vacuum, and a wall surface extending therebetween. A body having capillary action is disposed in the chamber and has one end connected to the conduit and a free surface spaced from the wall surface in line of sight thereof. Heating means for the wall surface heats the body radiantly and causes monomer carried thereby to evaporate.

9 Claims, 3 Drawing Sheets

APPARATUS FOR VAPORIZING MONOMERS THAT FLOW AT ROOM TEMPERATURE

BACKGROUND OF THE INVENTION

The invention relates to apparatus for the evaporation of monomers which are liquid at room temperature and have a low vapor pressure, especially those from the group TEOS (tetra-ethyl orthosilicate), TMS (tetramethylsilane) and HMDS (hexamethyldisiloxane), in the production of thin layers containing silicon and oxygen by chemical vapor deposition (CVD) in a vacuum on substrates, through the use of a flow adjuster having an evaporator connected to its output.

Plasma processes and vapor deposition processes are used at pressures below atmospheric pressure (vacuum) for producing coatings containing silicon and oxygen. The starting monomers are liquids, such as TEOS, TMS and HMDS, which are characterized by a relatively low vapor pressure at room temperature. On account of the extremely high purity required of these compounds, a so-called delayed boil often occurs when they are evaporated, i.e., an abrupt, explosive evaporation of relatively great amounts of liquid, and hence an irregular mass flow. This property is especially pronounced in the case of TEOS.

Through the article by B.L. Chin and E.P. van de Ven entitled, "Plasma TEOS Process for Interlayer Dielectric Applications," published in "Solid State Technology," Apr. 1988, pages 119 to 122, it is known to pump TEOS in liquid form into the vacuum reactor where it is evaporated and mixed with auxiliary gases. In spite of a computer-controlled liquid pump with a repeatable throughput it is not possible to produce a sufficiently constant mass flow on account of the intermittent evaporation of the liquid in the vacuum.

In considering these things it must be borne in mind that any irregularity in he mass flow is reflected in irregular coating properties and, if it is a reactive process that is involved, there will also be differences in the stoichometry of the coating composition.

Through the article by S.P. Mukherjee and P.E. Evans, "The deposition of thin films by the decomposition of tetra-ethoxysilane in a radio-frequency glow discharge," published in "Thin Solid Films," 1972, pp. 105–118, it is known to evaporate TEOS with a temperature-controlled evaporator which permits a defined increase of vapor pressure. In this case, too, continuous evaporation is virtually unachievable. If other monomers are to be evaporated, the apparatus must be carefully adapted to the vapor pressure curves of these monomers. Furthermore, the method in question is limited in its application, since it is not possible to achieve an arbitrarily high vapor pressure, and the easily condensable vapors can be transported and metered only in an unsatisfactory manner.

U. Mackens and U. Merkt describe a very similar method with comparable disadvantages in their article, "PLASMA-ENHANCED CHEMICALLY VAPOUR-DEPOSITED SILICON DIOXIDE FOR METAL/OXIDE SEMICONDUCTOR STRUCTURE ON InSb," published in "Thin Solid Films," 1982, pages 53–61.

Through the article by R. E. Howard, "Selecting Semiconductor Dopants for Precise Process Control, Product Quality and Yield and Safety," published in "Microelectronic Manufacturing and Testing," December 1985, pages 20–24, it is furthermore known to pass a noble gas (argon, helium) through a liquid monomer contained in a quartz vessel, in which the noble gas entrains the monomers. Disadvantageous in this method is the lack of information on the amounts of the monomer actually reaching the reaction chambers. Furthermore, additional gases must always be put in, and in many applications the result is an unacceptable limitation in regard to the choice of the working parameters of pressure and gas flow.

Lastly, a method of the kind described above is disclosed in EP-OS 0 239 664, in which a needle valve is used as the flow adjuster and is connected to an evaporator not further described. The result of such an arrangement is that the monomer evaporates more or less uncontrolledly behind the needle valve which forms a constriction. The only purpose the evaporator then serves is to evaporate any entrained liquid droplets and thus to assure complete evaporation. Consequently a constant mass flow cannot be achieved even with this known method.

The purpose of the invention is therefore to devise a method of the kind described above, in which a constant, precisely controllable vapor flow or rate of flow can be sustained over a long period of time.

SUMMARY OF THE INVENTION

A mass flow regulator is used as the flow adjuster and the monomer pumped thereby is fed in the liquid state to the evaporator in which the complete evaporation is produced at the pressure of the vacuum by a heated body having a capillary action.

In a method of this kind the evaporation takes place not at an uncontrollable point behind the flow adjuster, but exclusively as well as completely within the evaporator. The mass flow regulator itself provides for a liquid monomer feed that can be controlled within extremely narrow limits. In other words, what is achieved is an extraordinarily controlled and precise feed of liquid monomers on the one hand, and on the other hand a very accurate evaporation at a location provided and arranged for it, namely within the evaporator and within the heated body having capillary action.

The mass flow regulator used in this method is a precision apparatus in which the required throughput, i.e., the flow per unit time, is preset, and the actual throughput is controlled to within very slight differences from the preset throughput.

A mass flow regulator outstandingly appropriate for this purpose is offered by Bronkkorst High-Tech B.V. of Ruurlo, Holland, under the model number F 902-FA. The principle of the measurement of the actual mass flow is based on a laminar flow in a heated conduit with the input of a constant electrical power. By measuring the difference in temperature between the input and the output of the conduit it is possible directly to determine the magnitude of the mass flow. The measured difference is compared with a preset value, and the result serves for the actuation of a magnetic valve consisting of a nozzle and a target plate situated in front of it, whose distance from the nozzle is controlled by a solenoid. In this manner the mass flow can be regulated with extreme accuracy and also controlled. The mass flow will be between 0.1 and 30 g/h at a linear characteristic with a maximum deviation of ± 0.83%.

It is especially advantageous to provide evaporation heat to the body having capillary action at least mostly by radiant heating.

In this manner the liquid monomer in any case does not contact the heated walls of the evaporator, so that no chemical changes of the monomer occur.

It is furthermore advantageous to give the body having the capillary action an elongated configuration and suspend it by its extremities, and to feed the liquid monomer to the one end of the body and withdraw the evaporated monomer from the free surface of the upper body and feed it into the reaction zone in a vacuum chamber.

It will also be advantageous to produce in the body having the capillary action a temperature gradient of positive sign from the end at which the liquid monomer enters to the end at which the vaporized monomer emerges.

The invention furthermore relates to an apparatus for the practice of the method described above, through the use of a flow adjuster having an evaporator connected to its output. The evaporator has an evaporating chamber with an entry end and an exit end, and a heating means for heating, and it is followed by a vacuum chamber for the performance of a chemical vapor deposition process.

For the achievement of substantially the same purpose, such an apparatus is characterized in accordance with the invention in that the flow adjuster is a mass flow regulator and that in the evaporating chamber a body having a capillary action is disposed whose one end is connected to the conduit coming from the mass flow regulator and which is held at a distance from the heated walls of the evaporator chamber but in a line of sight with the latter.

Especially important is the body having the capillary action. It can be a porous ceramic and/or mineral material, a fleece, a fabric or a string of a fibrous inorganic or organic material. The pore size or the distance between the individual fibers determines the extent of the capillary action. Such bodies can also be described as "sponge-like."

It is quite especially desirable to have the entry end of the body having the capillary action inserted into the conduit carrying the liquid monomer, and to have the longitudinal axis of the body inclined downwardly at a low angle from the said chamber axis. In this manner the liquid monomer will enter the absorbent material at one end and migrate, while portions of it are continously evaporating, toward the exit end of the body having the capillary action. The design will at the same time be such that no liquid will reach the exit end, so that all of the liquid monomer will be converted from the liquid to the vapor phase within the said body.

DETAILED DESCRIPTION OF THE PREFERRED EMBODIMENTS

Figure 1:
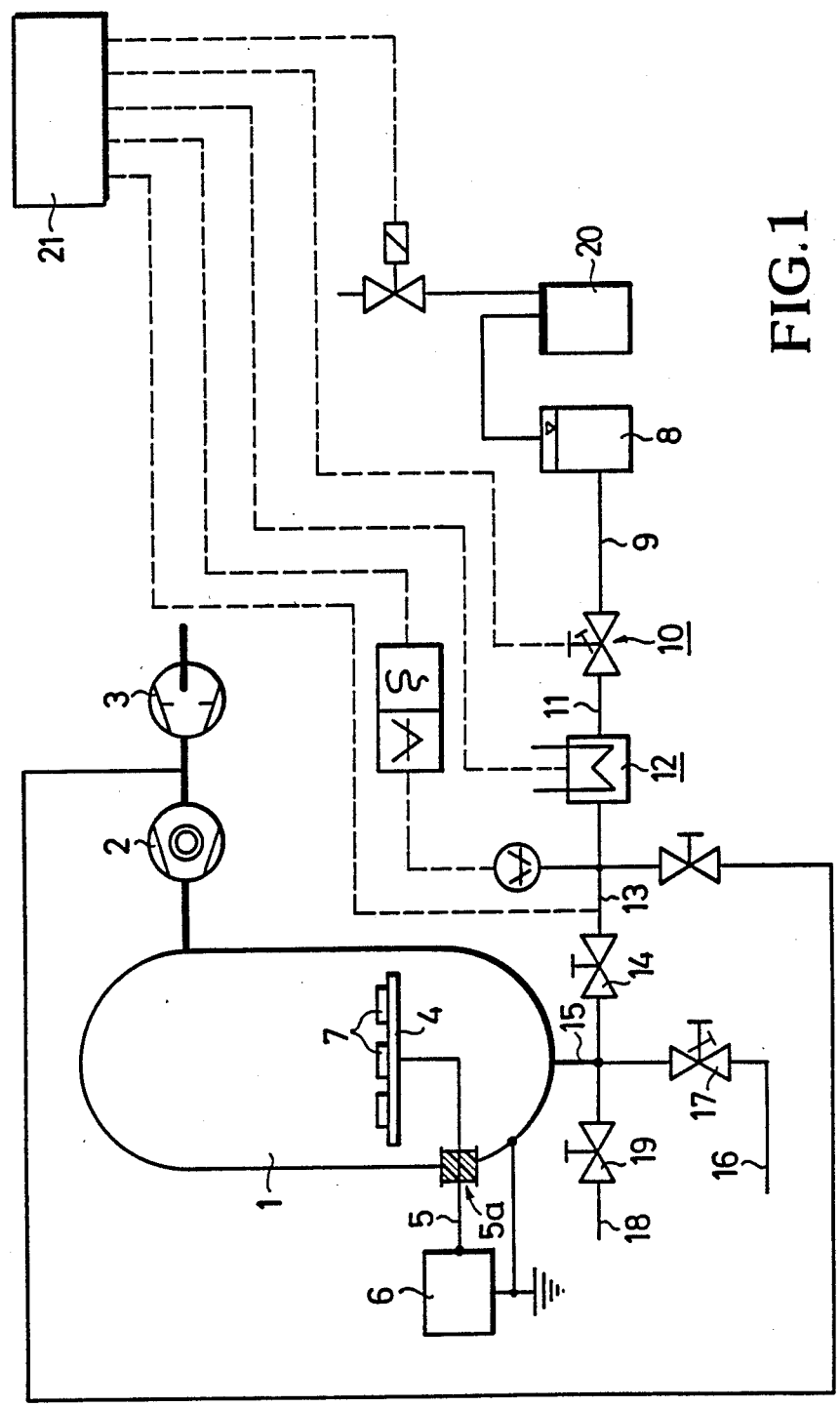
FIG. 1 is a schematic diagram of a complete installation for performing a CVD process.

FIG. 1 shows a vacuum chamber 1 in which a CVD process is performed and which is connected to two vacuum pumps 2 and 3. In the vacuum chamber 1 there is a substrate holder 4 which is connected by a conductor 5 to a high-frequency generator 6. The vacuum chamber 1 is at ground potential, and the conductor 5 is brought through the chamber wall by means of a lead-through insulator 5a. On the substrate holder 4 are a plurality of substrates 7 which are to be coated by the CVD process.

The liquid monomer is in a supply tank 8 and it is fed through a conduit 9 to the mass flow regulator 10. From the latter in turn runs a liquid-carrying conduit 11 to an evaporator 12 which will be further explained below in connection with FIGS. 2 and 3. From the evaporator 12 a vapor line 13 runs through a shut-off valve 14 and another conduit 15 to the vacuum chamber 1. An inert gas with which a glow discharge can be sustained in the vacuum chamber 1 in the area of the substrate holder 4 is fed into conduit 15 through a conduit 16 and a control valve 17, while additional doping and additive gases can be fed through an additional conduit 18 and an adjusting valve 19 into the vacuum chamber 1. An air dryer 20 is connected to the top of the supply tank 8.

The entire system is centrally controlled by a control unit 21 which is connected to the individual units by numerous conductors and conduits represented by broken lines. Since the system according to FIG. 1 belongs to the state of the art, with the exception of the mass flow regulator 10 and the evaporator 12, there is no need to go any further into the manner of operation.

Figures 2, 3:
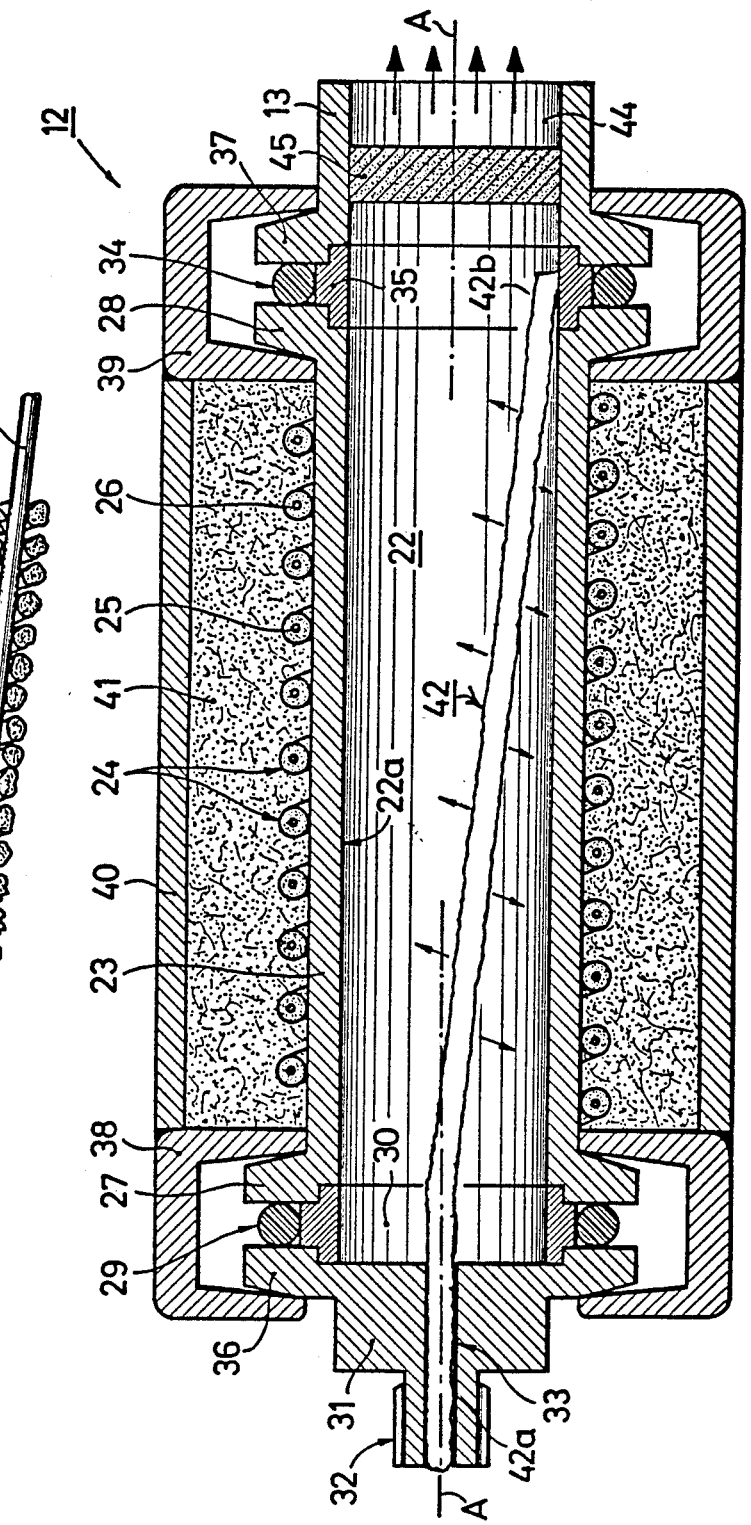
FIG. 2 is an axial section through an evaporator in accordance with the invention.
FIG. 3 is an enlarged detail from FIG. 2.

The evaporator 12 in FIG. 2 has an evaporating chamber 22 whose essential part is formed by a hollow cylinder 23 which is surrounded by a heating coil 24. This heating coil consists of a central heating conductor 25 and an insulating cover 26 surrounding it; the terminal ends are not shown.

The hollow cylinder 23 is provided at both ends with annular flanges 27 and 28. An end cap 31 is placed on the annular flange 27 at the entry end, with the interposition of an 0-ring 29 and a centering ring 30. The end cap 31 has a threaded nipple 32 to which the liquid-carrying conduit 11 (FIG. 1) is connected. Inside of the end cap 31 is a conduit 33 for carrying the liquid monomer.

The vapor line 13 (FIG. 1) is connected to the flange 28 by an 0-ring 34 and a centering ring 35. The end cap 31 and the vapor line 13 have flanges 36 and 37 complementary to the flanges 27 and 28. The outer sides of the pairs of flanges 27, 36, and 28, 37, are tapered so that the flanges can be clamped against one another by pairs of hollow semicircular clamping rings 38 and 39.

The heating coil 24 between the clamping rings 38 and 39 is surrounded by an outer jacket 40. The space between the outer jacket and the hollow cylinder 23 is filled with a thermal insulation material 41.

In the evaporating chamber 22 there is an elongated body 42 that provides a capillary action, one end 42a of which is connected to the conduit 33 coming from the mass flow regulator, i.e., one end [of this elongated body] is inserted into this conduit. The evaporating chamber 22 has a heated wall surface 22a, and it can be seen that the body 42 is directly exposed to this wall surface, without touching it. Due to the low-angle of inclination of the body 42, the liquid monomer introduced into the conduit 33 can more easily flow downhill through the body 42, while the evaporated monomer issues in the direction of the arrows from the entire surface of this body.

It can be seen in FIG. 2 that the heat of evaporation is supplied to the body 42 having the capillary action almost exclusively by radiant heat from the wall surface 22a.

It can also be seen in FIG. 2 that a heated filter 45 is disposed on the exit end 44 of the evaporating chamber 22. This filter serves to prevent any surface particles that come loose from the body 42 from entering the vacuum chamber 1. The heating serves to prevent monomer vapors from condensing in the filter itself.

As FIG. 3 shows, the body 42 having the capillary action consists of an elongated rod 46 on which the string of wick material 47 is wound helically. Instead of this string of wick material, a tubular or sock-like wick can be used, which is drawn onto the rod 46.

In the case of the subject matter of FIG. 2, the liquid concentration decreases from left to right and the vapor concentration increases from left to right, while the temperature increases from left to right.

It has been observed that the precisely metered liquid evaporates smoothly and controlledly and issues at the surface 43.

Figure 4:
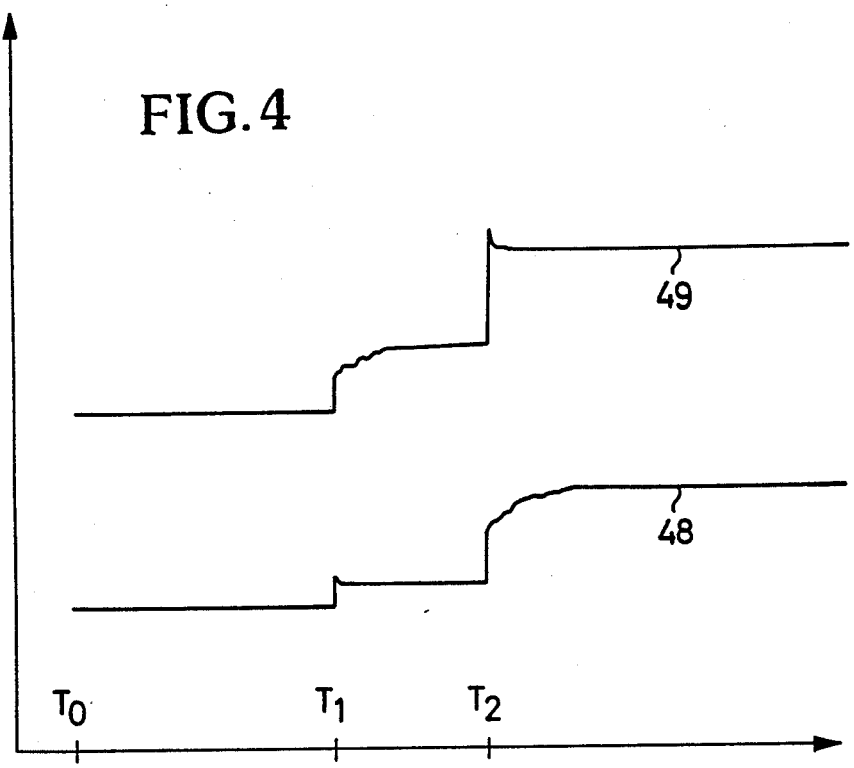
FIG. 4 is a diagram showing two curves indicating the pressure in the evaporator and in the receptacle from start-up to steady operation.

In FIG. 4 the abscissa is the time axis and the ordinate the pressure. The pumping down of the vacuum chamber, and hence the evacuation of the entire system, begins at time $T_0$. At time $T_1$ the operation of the evaporator 12 begins, and at time $T_2$ the pressure curves become steady. The bottom curve 48 indicates the pressure in vacuum chamber 1, while the upper curve 49 shows the pressure in the evaporator 12. It can be seen that these pressures follow a very constant and rectilinear course.

Figure 5:
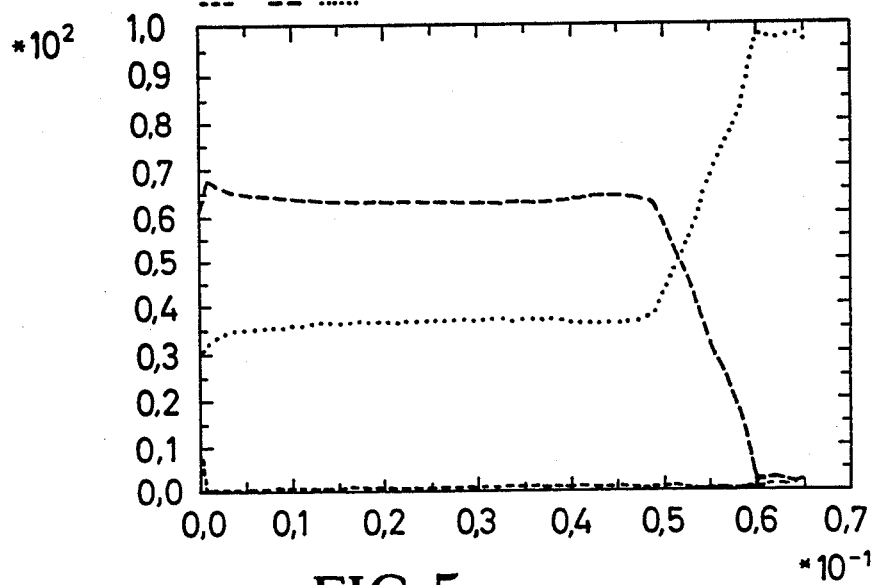
FIG. 5 is an Auger spectrogram of a coating which was made by the method in accordance with the invention, in an apparatus in accordance with FIGS. 1 to 3.

In FIG. 5, the left margin of the diagram represents the surface of the coating on the substrate. Starting at this surface an Auger electron ion beam analysis was performed. The very straight and level shape of the concentration curves for silicon and oxygen up to about 0.5 show the precision of the coating that was formed. This is to be attributed to the very precise regulation of the amount of monomer evaporated.

The inventive apparatus is useful in a preferred method of producing silicon dioxide coatings from TEOS for microelectronic applications.

The vacuum chamber shown in FIG. 1 is an apparatus of the model Z 550 made by Leybold AG, in which the substrate holder 4 is operated at a frequency of 13.65 MHz. The substrates used were silicon wafers with a diameter of 100 mm, on which vertical aluminum test steps were disposed with a rise of 750 mm and a distance of about 2 microns between steps. The CVD process was performed, after an appropriate previous treatment of the substrates, at a working pressure of $2 \times 10^{-2}$ mbar, the TEOS being fed at a rate of 10 g/h. At the same time oxygen was admixed at 100 sccm. Evaporator 12 was kept at a temperature of 150° C.; the substrate temperature was about 100° C. The coating time was 15 minutes.

We claim:

1. Apparatus for the evaporation of monomers which are liquid at room temperature and have a low vapor pressure in the production of thin coatings containing silicon and oxygen by chemical vapor deposition in a vacuum on substrates, said apparatus comprising:
   a mass flow regulator for adjusting the flow of the monomer,
   an evaporator comprising an evaporating chamber having an entry end, an exit end, and a wall surface extending therebetween, said entry end comprising a conduit connected to the output of said mass flow regulator, said exit and being connected to said vacuum, said evaporator further comprising means for heating said chamber, and a body having capillary action disposed in said chamber, said body having one end connected to the conduit, said body having a free surface spaced at a distance from the wall surface and in line of sight of the wall surface.

2. Apparatus in accordance with claim 1 characterized in that the evaporating chamber is constructed as a hollow cylinder surrounded by the heating means and having a wall at the entry end, into which the conduit carrying the liquid monomer leads, and that the body having the capillary action is disposed in the hollow cylinder in such a manner that its one end is facing the conduit carrying the monomer, and that its free surface faces the wall surface of the evaporating chamber.

3. Apparatus in accordance with claim 2, characterized in that said one end of the body having the capillary action is inserted into the conduit carrying the liquid monomer.

4. Apparatus in accordance with claim 1, characterized in that the body having the capillary action comprises a wick material.

5. Apparatus in accordance with claim 4, characterized in that the body having the capillary action further comprises an elongated supporting member which is surrounded by said wick material.

6. Apparatus in accordance with claim 5, characterized in that the wick material is wound on the supporting member.

7. Apparatus in accordance with claim 1, further comprising a heated filter disposed on the exit end of the evaporating chamber.

8. Apparatus as in claim 1 wherein said means for heating said chamber comprises means for heating said wall surface, resulting in a heated wall surface which heats said body having capillary action by radiant heat.

9. Apparatus as in claim 1 wherein said body has a longitudinal axis which runs downward from said entry end toward said exit end.

* * * * *

UNITED STATES PATENT AND TRADEMARK OFFICE
CERTIFICATE OF CORRECTION

PATENT NO. : 4,947,789

DATED : August 14, 1990

INVENTOR(S) : Ingo Hussla et al

It is certified that error appears in the above-identified patent and that said Letters Patent is hereby corrected as shown below:

Column 1, line 38, delete "he" and insert --the--.

Column 6, line 16, delete "and" and insert --end--.

Signed and Sealed this

Fifteenth Day of December, 1992

Attest:

DOUGLAS B. COMER

Attesting Officer      Acting Commissioner of Patents and Trademarks